US008836090B1

(12) United States Patent
Veeramma

(10) Patent No.: US 8,836,090 B1
(45) Date of Patent: Sep. 16, 2014

(54) FAST RECOVERY SWITCHING DIODE WITH CARRIER STORAGE AREA

(71) Applicant: Subhas Chandra Bose Jayappa Veeramma, Lampertheim (DE)

(72) Inventor: Subhas Chandra Bose Jayappa Veeramma, Lampertheim (DE)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 13/783,134

(22) Filed: Mar. 1, 2013

(51) Int. Cl.
*H01L 29/861* (2006.01)

(52) U.S. Cl.
CPC .................................. *H01L 29/8613* (2013.01)
USPC .......................................................... 257/653

(58) Field of Classification Search
CPC ............ H01L 27/1463; H01L 27/1464; H01L 27/14609; H01L 27/14687; H01L 27/14632; H01L 21/76224; H01L 29/8613
USPC .......... 257/E21.608, 339, 139, 141, 341–343, 257/347, 401, 654; 438/612–614, 656, 652, 438/328
See application file for complete search history.

(56) References Cited

U.S. PATENT DOCUMENTS

| 8,093,652 | B2 | 1/2012 | Veeramma et al. | 257/329 |
| 8,153,481 | B2 | 4/2012 | Veeramma | 438/140 |
| 2003/0218220 | A1* | 11/2003 | Takahashi et al. | 257/409 |
| 2005/0158979 | A1* | 7/2005 | Momota et al. | 438/614 |
| 2006/0255379 | A1 | 11/2006 | Veeramma | 257/288 |
| 2009/0160008 | A1* | 6/2009 | Fujiwara et al. | 257/471 |
| 2010/0025820 | A1* | 2/2010 | Suekawa | 257/584 |

* cited by examiner

*Primary Examiner* — Wael Fahmy
*Assistant Examiner* — Sue Tang
(74) *Attorney, Agent, or Firm* — Imperium Patent Works; T. Lester Wallace; Darien K. Wallace

(57) ABSTRACT

A power device (such as a power diode) has a peripheral die area and a central area. The main PN junction of the device is formed by a P+ type region that extends down into an N− type layer. The central portion of the P+ type region has a plurality of openings so mesa structures of the underlying N− type material extend up to the semiconductor surface through the openings. Due to the mesa structures being located in the central portion of the die, there are vertically extending extensions of the PN junction in the central portion of the die. Minority carrier charge storage is more uniform per unit area across the surface of the die. Due to the form of the P+ type region and the mesa structures, the reverse recovery of the PN junction exhibits a soft characteristic.

22 Claims, 14 Drawing Sheets

SIDE VIEW ALONG LINE B-B'

TOP-DOWN VIEW

TOP-DOWN VIEW OF SILICON SURFACE
(NO METAL LAYER AND NO PASSIVATION LAYERS SHOWN)

SIDE VIEW ALONG LINE C-C'

DEPTH INTO DIE
(FROM SEMICONDUCTOR SURFACE)
DOPING PROFILE

| REGION OR STRUCTURE | COMPOSITION AND DIMENSIONS | DESCRIPTION |
|---|---|---|
| METAL CATHODE ELECTRODE (16) | ALUMINUM (Al) APPROX 4UM THICK OR AlTiNiAg | COVERS ENTIRE BOTTOM SURFACE OF N+ TYPE SUBSTRATE LAYER |
| METAL ANODE ELECTRODE (3) | ALUMINUM APPROX 4UM THICK | |
| FLOATING FIELD PLATE (19) | ALUMINUM APPROX 4UM THICK APROX 15-40UM WIDE | |
| P+ TYPE REGION (4) | 6E14cm-2 (1E18cm-3 DOPED) BORON IMPLANTED TO A DEPTH OF 10UM | |
| P+ TYPE FLOATING GUARD RING (6) | 1E18cm-3 DOPED WITH BORON APPROX 10UM WIDE IMPLANTED TO A DEPTH OF 10UM | |
| N- TYPE LAYER (5) | EPITAXIAL SILICON 28Ωcm DOPED EPI LAYER IS 40-65UM THICK | |
| MESA STRUCTURES (8-13) | 140UM X 1000UM | ORGANIZED IN AN ARRAY IN THE CENTRAL PART OF THE DIE |
| N+ TYPE LAYER (14) | SUBSTRATE SILICON 1E19cm-3 DOPED WITH PHOSPHORUS SUBSTRATE IS 200UM THICK | |
| FIRST DIELECTRIC LAYER (17,18,20) | THERMAL OXIDE OR GLASS (1-2UM) OR SIPOS (0.2-0.5UM) APPROX 2UM THICK | |
| SECOND DIELECTRIC LAYER (PASSIVATION LAYER) (2) | POLYMIDE 5-20UM OR SILICON NITRIDE 0.5-2 UM THICK | |
| N+ TYPE CHANNEL STOPPER (7) | 1E19cm-3 DOPED 100-150UM WIDE AT PERIPHERY OF DIE IMPLANTED TO A DEPTH OF 12-15UM | |
| LOCAL LIFETIME CONTROL (AXIAL LIFETIME KILLERS) | IMPLANTING WITH IONS HE++ OR PROTONS | LOCALLY IMPLANT ONTO INTO P+ REGION 4. IMPLANT TO A DEPTH OF ~ 8UM |
| UNIFORM LIFETIME CONTROL | ELECTRON IRRADIATION AND/OR DOPING WITH HEAVY METALS (AU OR PT) | |

FIG. 7

MINORITY CARRIER CHARGE DISTRIBUTION
UNDER FORWARD BIAS CONDITIONS

MINORITY CARRIER CHARGE DISTRIBUTION
UNDER REVERSE BIAS CONDITIONS

| | PRIOR ART DIODE | DIODE OF FIGS. 1-5 |
|---|---|---|
| $I_F$ | 50A | 50A |
| $V_R$ | 400V | 400V |
| $t_{rr}$ | 35ns | 45ns |
| $I_{RM}$ | 30A | 30A |
| UNIFORM LIFETIME KILLER CONCENTRATION E- IRRADIATION | 1000kGy | 1000kGy |
| CENTRALLY-LOCATED AUXILIARY CHARGE STORAGE | NO | YES |
| AXIAL KILLER DOSE | <2E12cm-2 | >2E12cm-2 |
| dI/dt (DURING TIME $t_b$ OF REVERSE RECOVERY) | >1000A/us (HIGHER) | 1000A/us (LOWER) |
| VOLTAGE OVERSHOOT | >400V | NO |
| SNAPPY DIODE | YES (WITH OSCILLATION) | NO |

COMPARISON OF 600V DIODES AT SWITCHING SPEED, 50A, 400V

FIG. 11

MINORITY CARRIER MOVEMENT WHEN GOING
FROM FORWARD BIAS TO REVERSE BIAS

MINORITY CARRIER MOVEMENT WHEN GOING
FROM FORWARD BIAS TO REVERSE BIAS

SECOND EMBODIMENT
(TOP-DOWN VIEW)

SECOND EMBODIMENT
(TOP-DOWN VIEW - NO METAL LAYER AND NO PASSIVATION LAYERS SHOWN)

CROSS-SECTIONAL SIDE VIEW OF A MESA STRUCTURE HAVING FLOATING P+ TYPE REGIONS

THIRD EMBODIMENT
(TOP-DOWN VIEW)

THIRD EMBODIMENT
(TOP-DOWN VIEW - NO METAL LAYER AND NO PASSIVATION LAYERS SHOWN)

FIFTH EMBODIMENT
(SIDE VIEW ALONG LINE B-B')

FIFTH EMBODIMENT
(SIDE VIEW ALONG LINE C-C')

FAST RECOVERY SWITCHING DIODE WITH CARRIER STORAGE AREA

TECHNICAL FIELD

The described embodiments relate to PN junctions in power devices, and more particularly to PN junctions that result in the power devices having soft reverse recovery characteristics.

BACKGROUND INFORMATION

An ideal diode is a two terminal device that has an anode electrode and a cathode electrode. If the voltage on the anode is positive with respect to the voltage on the cathode, then a forward voltage is said to be present across the diode. If the voltage on the anode is negative with respect to the voltage on the cathode, then a reverse voltage is said to be present across the diode. For a forward voltage greater than a threshold voltage, the diode is to conduct a forward current and is to have as small of a resistance to current flow as possible. For a reverse voltage, the diode is to block reverse current flow and is to present as high of a resistance to current flow as possible. In a real diode, however, when the diode is forward biased and is then switched to be reverse biased, a burst of reverse current flows from the cathode to the anode. The PN junction of the diode has a capacitance. A charge is stored in this capacitance. When the voltage across the diode is switched from being a forward voltage to being a reverse voltage, the charge stored in the junction must be discharged and this discharging gives rise to the burst of reverse current. Once the charge has been discharged, then the reverse current stops flowing and the diode is seen to block reverse current flow. The magnitude of the burst of reverse current is generally specified as the reverse recovery peak current $I_{RM}$. The amount of time for the reverse recovery current to decrease from $I_{RM}$ to a specified reverse current (for example, 0.2 of $I_{RM}$) is specified as the reverse recovery time $t_{rr}$.

The reverse recovery characteristic of a diode can be described as "snappy" or as "soft". During a reverse recovery episode, once the reverse current has peaked to its largest $I_{RM}$ value, if the reverse current then abruptly returns to zero current then the diode may be said to have a snappy characteristic. If, on the other hand, the reverse current returns to zero current more slowly then the diode is said to have a soft characteristic.

In a typical power diode application, if the diode has a snappy reverse recovery characteristic, then the reverse recovery current may decrease to zero current so fast and in such a way that the reverse recovery current actually overshoots zero current and for a short period of time becomes a forward current. The reverse recovery current may then oscillate around zero current before it stabilizes to its zero value for steady state reverse bias operation. This overshoot and/or ringing of the reverse recovery current is accompanied by a corresponding momentary high reverse voltage and/or voltage ringing. The momentary high reverse voltage may be so large that it may exceed the rated reverse blocking voltage of the diode, thereby destroying the diode. In order to prevent the diode from being destroyed, it may be necessary to provide expensive and cumbersome snubber circuitry.

SUMMARY

A power device (such as a high voltage power diode die) has a peripheral die area and a central die area. The main PN junction of the device is formed by a P+ type region that extends down into an N− type layer. In one example, the N− type layer is an epitaxial silicon layer that is disposed on an N+ type substrate silicon layer. A first metal electrode (such as a metal anode electrode) is disposed on the top of the die and makes contact with the P+ type region. A second metal electrode (such a metal cathode electrode) is disposed on the bottom of the die in contact with the N+ type substrate layer.

In one novel aspect, the central portion of the P+ type region has a plurality of openings so that N− type mesa structures of the underlying N− type layer material extend up to the semiconductor surface through the openings. Due to the N− type mesa structures being located in the central portion of the die, there is a set of corresponding vertically-extending extensions of the PN junction in the central portion of the die. These vertically-extending extensions of the PN junction extend upward from the planar PN junction that is disposed along the bottom of the P+ type region. The vertically-extending extensions of the PN junction serve to increase the amount of minority carrier charge storage per unit area in the central portion of the die. As a result, minority carrier concentration across the die is more uniform per unit area at the time when the PN junction switches from a forward voltage to a reverse blocking voltage. When the voltage across the PN junction is switched from the forward voltage to the reverse blocking voltage, there are more minority carriers present in the central part of the die due to the centrally-located mesa structures. Uniformity of the minority carrier charge storage per unit area across the surface of the die at the time of switching (from the forward voltage condition to the reverse voltage condition) causes the reverse recovery of the PN junction to exhibit a soft characteristic.

In some examples, the peak reverse recovery current $I_{RM}$ of the device is not increased despite the fact that the mesa structures increase the amount of PN junction present in the device. Recombination center concentration in the silicon is increased so that more minority charge carriers will be removed from the depletion region by recombination, thereby preventing these minority carriers from contributing to peak reverse recovery current. The effect of the increased recombination center concentration is made to counteract the effect the increased amount of PN junction has on peak reverse current $I_{RM}$ (after switching from a given forward voltage).

Centrally-located mesa structures are but one example of centrally-located minority carrier charge storage structures that can be used in accordance with the present invention to cause the reverse recovery of the PN junction to exhibit a soft characteristic. In a second embodiment, additional vertically-extending PN junction is provided in the central part of the die by breaking the P+ type region into multiple portions. A narrow strip of the N− type material of the underlying N− type epitaxial layer extends up to the semiconductor surface in the narrow area between each adjacent pair of P+ type regions. Due to the vertically-extending PN junction formed where the vertical edges of the narrow N− type strip meets the vertical side edges of the P+ type regions, minority carrier storage per unit area is increased in the central portion of the die.

In some examples, the width of a mesa structure or the width of a narrow strip structure is made wider, and one or more floating P+ type regions are provided so that the floating P+ type regions extends down into the top of the mesa structure or into the top of the narrow strip structure. At the upper semiconductor surface, the mesa structures can have a shape such as a rectangle, a square, an elongated strip, a circle, a polygon, or another shape. In some embodiments the centrally-located minority carrier charge storage area is provided without any mesas, but rather a portion of the metal anode electrode is separated from the underlying P+ type anode region by a pad feature of the thin dielectric layer. In another example, metal of the metal anode electrode does not extend over the pad feature. In another example, there is neither metal of the anode electrode nor any pad feature of the thin dielectric layer overlying the minority carrier charge storage area. The minority carrier charge storage areas are generally organized as a two-dimensional array under the central part of the metal anode electrode when the diode die is considered from the top-down perspective.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 7 is a table that sets forth characteristics of the various regions and parts of the die of FIGS. 1-5.

FIG. 11 is a table that shows an operational comparison of the die of FIGS. 1-5 with a prior art diode.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "underneath", "upper", "top", "up", "down", "lower", and "bottom" are used herein to describe relative orientations between different parts of the structure being described, and it is to be understood that the overall structure being described can actually be oriented in any way in three-dimensional space. The notations N+, N−, N, P++, P+, and P are only relative, and are to be considered in context, and do not denote any particular dopant concentration range.

Figure 1:
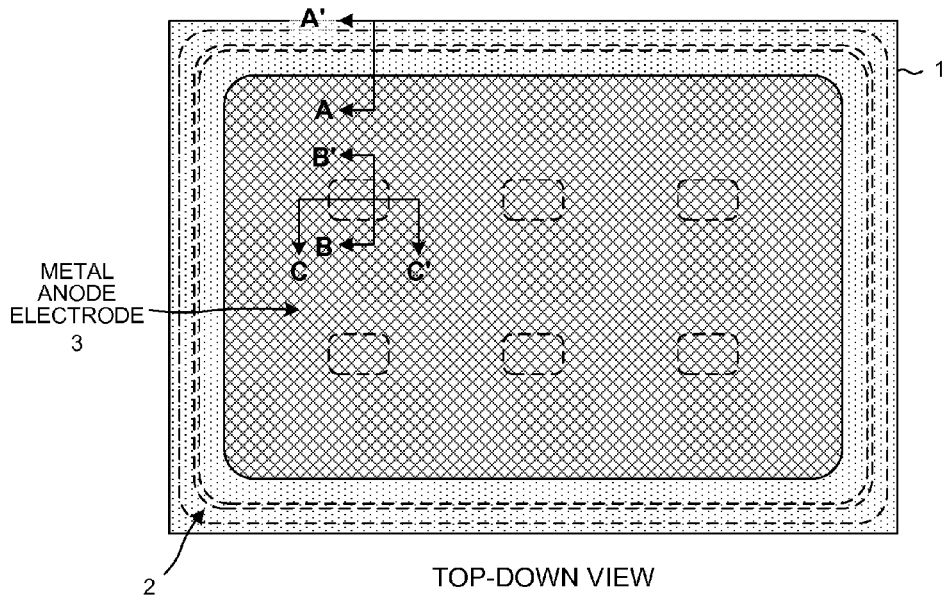
FIG. 1 is top-down diagram of a high voltage power diode die in accordance with one novel aspect.

FIG. 1 is a top-down diagram of a power diode integrated circuit die 1 in accordance with one novel aspect. The die 1 has a rectangular shape when considered from the illustrated top-down perspective. The peripheral edge portion of the upper surface of the die is covered with a rectangular ring 2 of a passivation layer as shown. The ring 2 of passivation may, for example, be a polyimide (also sometimes referred to as polymide or polymid) or a silicon nitride layer that is approximately 5-20 um polyimide or 0.5-2 um SIN thick. The central portion of the upper surface of the die has a covering metal anode electrode 3. Metal anode electrode 3 may, for example, be an aluminum layer that is approximately 4 um thick.

Figure 2:
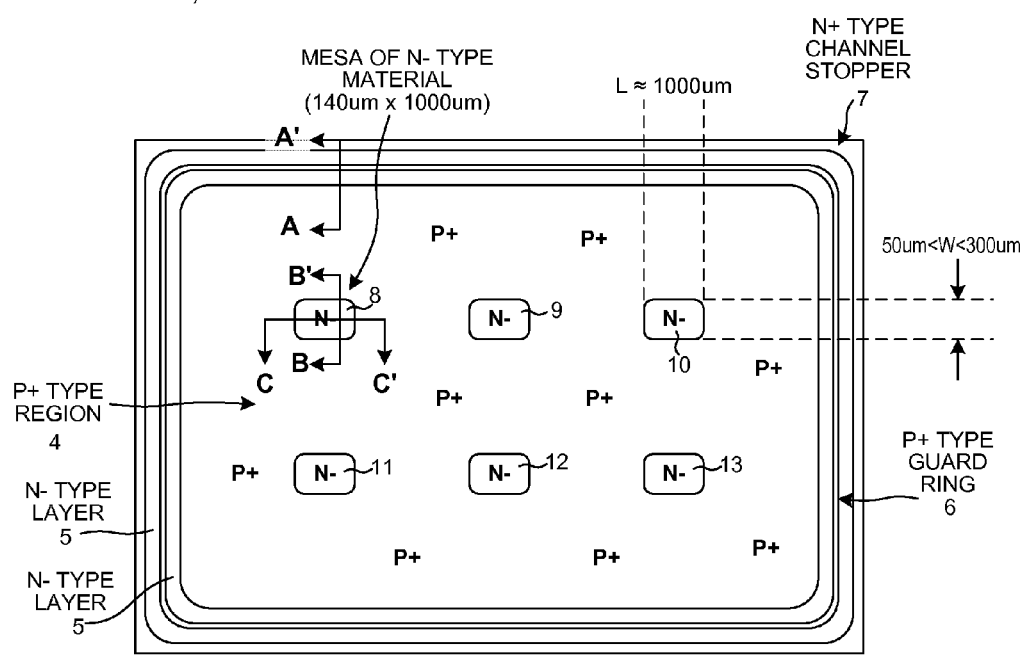
FIG. 2 is top-down diagram of the die of FIG. 1 with the metal, passivation, and insulation layers not shown.

FIG. 2 is a diagram looking down onto the upper surface of the semiconductor material of the die 1 of FIG. 1. Passivation, metallization and insulation layers are not shown in FIG. 2 so that the regions of semiconductor material can be shown. A specially-shaped P+ type anode region 4 extends 10 um down into an N− type layer 5 of N− type epitaxial silicon. A floating P+ type guard ring 6 extends around the periphery of the P+ type anode region 4, and an N+ type channel stopper 7 at the peripheral upper edge of the die extends around the floating guard ring. There are six rectangular openings in the center portion of the P+ type anode region 4. P+ type anode region 4 therefore has a mesh-shape that defines the two-dimensional array of openings. N− type semiconductor material of the underlying N− type layer 5 is illustrated in FIG. 2 extending up through the six openings in the mesh so that six mesa structures 8-13 of N− type semiconductor material are formed. Each of the six mesa structures 8-13 extends up to the planar upper semiconductor surface 15 of the die. Each of the six mesa structures 8-13 has a substantially rectangular planar surface in the plane of the upper surface 15 of the semiconductor material of the die.

In the example of FIG. 2, the N− type mesas are disposed in an array of rows and columns under a central area of the metal anode electrode 3 when the die is considered from a top-down perspective; there are relatively few N− type mesas in a peripheral area of the metal anode electrode (when the die is considered from the top-down perspective) and the peripheral area is more than two thirds as large as the central area. The density of N− type mesas is higher under this central third of the metal anode electrode than it is under the peripheral two-thirds of the metal anode electrode, in fact in the example of FIG. 2 all of the N− type mesas are disposed under the central third.

Figure 3:
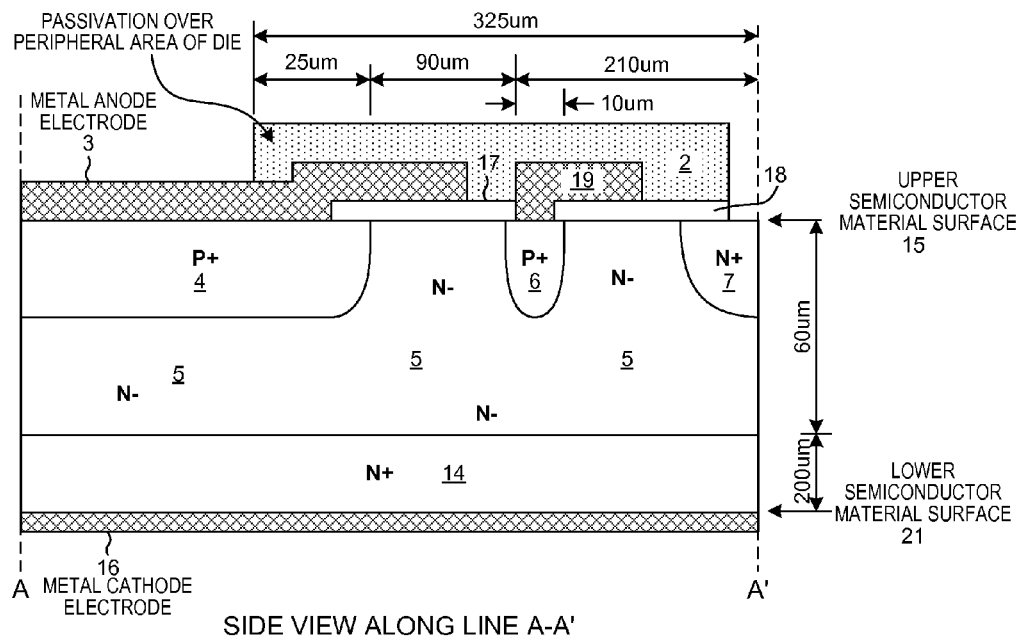
FIG. 3 is a cross-sectional side view taken along line A-A' in the die of FIG. 2.

FIG. 3 is a cross-sectional diagram taken along line A-A' in FIG. 1, for a simplified case in which there is only one guard ring. The innermost floating P+ type guard ring 6 is spaced about 90 um away from the outer peripheral edge of the P+ type anode region 4. In a 600V rated diode there would be three guard rings; in a 1200V rated diode there would be five guard rings; in an 1800V rated diode there would be nine guard rings. For each voltage class, the distance between the anode region 4 and the first guard ring is empirically adjusted.

In FIG. 3, the N– type layer 5, which is sometimes called a drift region, is a 60 um thick layer of epitaxially-grown silicon that was grown on N+ type substrate silicon layer 14. N– type layer 5 is lightly doped to 28 ohm-cm. N+ type substrate layer 14 is 200 um thick in this example and is doped with phosphorus. The P+ type regions 4 and 6 and the N+ type channel stopper region 7 are formed down into the N– type layer 5 from the upper surface 15 of the semiconductor material. A layer of metal on the bottom surface of N+ type substrate layer 14 is a metal cathode electrode 16. This metal cathode electrode 16 covers the entire bottom surface of the die 1. A patterned feature 17 of a thin first dielectric layer covers the N– type material between the P+ type region 4 and the floating P+ guard ring 6. Feature 18 is another feature of this first thin dielectric layer. Feature 18 extends around the periphery of the die and covers the inner part of the N+ type channel stopper 7 as shown. The thin dielectric layer may be a 0.5 to 2 um thick layer of thermal oxide, or glass, silicon nitride, or SIPOS (Semi-Insulating Polycrystalline Silicon). After a metal layer has been deposited and patterned and etched to form the metal anode electrode 3 and a floating metal field plate 19, the ring 2 of thicker peripheral dielectric passivation is formed. The thicker peripheral dielectric passivation layer may be a 5 to 20 um thick polyimide layer or 0.5 to 2 um silicon nitride or 0.2-0.5 um thick SIPOS. The thick passivation layer prevents arching of the field plate and prevents humidity from penetrating down into the top of the die. There is a 50 um opening in the thick passivation layer at the edge of the die provided for dicing.

Although only one guard ring and associated floating field plate is illustrated, the actual die typically has several concentrically-oriented guard ring and field plate structures. For the overall field ring structure to be fully effective, the spacing between each pair of adjacent guard rings should be individually optimized. Unless properly designed, the guard ring and field plate structures can suffer from surface instabilities caused by high electric fields and passivation charges generated during processing. The surface charges can cause a variation in the surface potential and can create conducting surface channels on the lightly doped semiconductor metal between rings. This alters the potential sharing between rings and device breakdown can occur wherever there is excess charge due to increased electric fields. The field plate 19 reduces passivation charge. The N+ type channel stopper region 7 prevents the depletion region from the main PN junction of the device from reaching the edge of the die 1 under high voltage reverse bias conditions. The combination of the guard rings, the field plates, and the die electric layer 18 helps increase the blocking voltage the die can tolerate before suffering breakdown.

Figure 4:
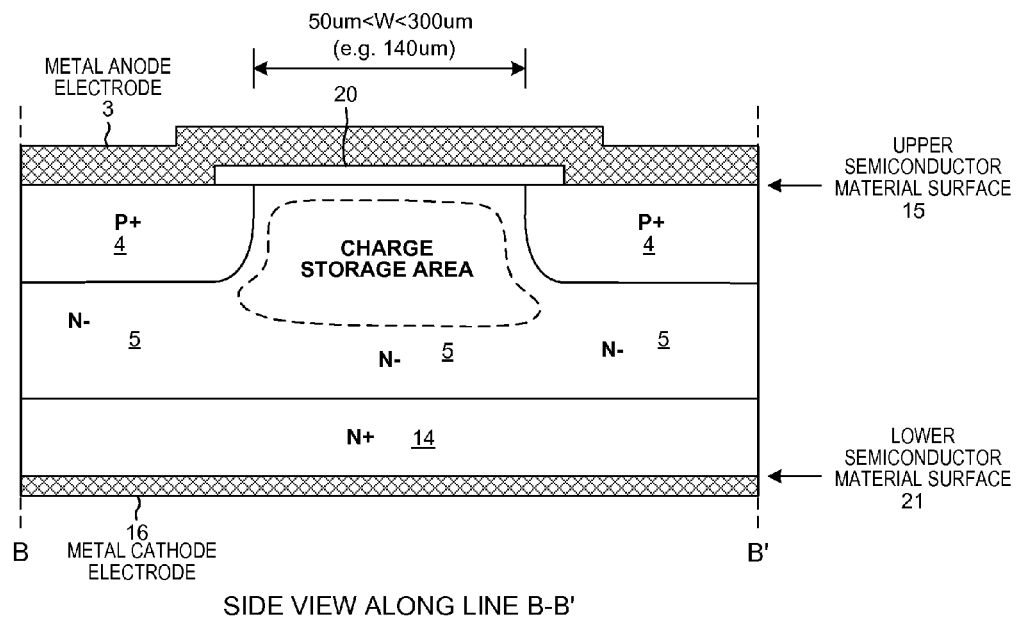
FIG. 4 is a cross-sectional side view taken along line B-B' in die of FIG. 2.
Figure 5:
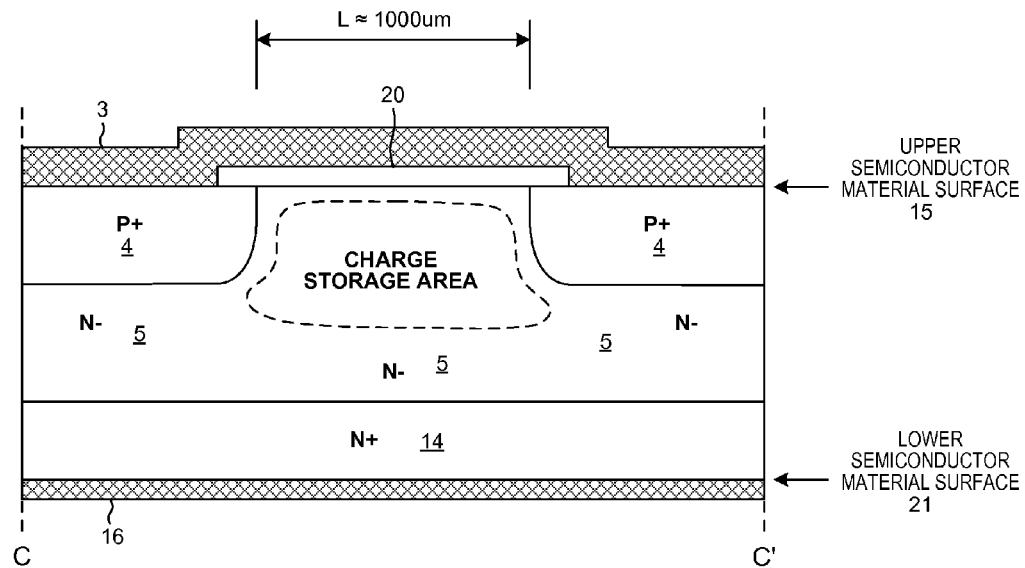
FIG. 5 is a cross-sectional side view taken along line C-C' in the die of FIG. 2.

FIG. 4 is a cross-sectional diagram taken along line B-B' in FIG. 1. FIG. 5 is a cross-sectional diagram taken along line C-C' in FIG. 1. Each of the mesa structures 8-13 of FIG. 2 is covered by a rectangular pad-like feature of the thin field dielectric layer. Pad feature 20 illustrated in FIG. 4 is the rectangular pad-like feature that covers mesa 8. Pad feature 20 entirely covers the upper planar semiconductor surface of mesa structure 8 so that metal of metal anode electrode 3 does not contact any portion of the N– type semiconductor material of layer 5. In this example, the top planar surface of the mesa structure 8 is a rectangular surface having a width of 140 microns and having a length of 1000 microns. The simplified top-down illustration of FIG. 2 that shows the mesas to be close to square is not to scale.

Figure 6:
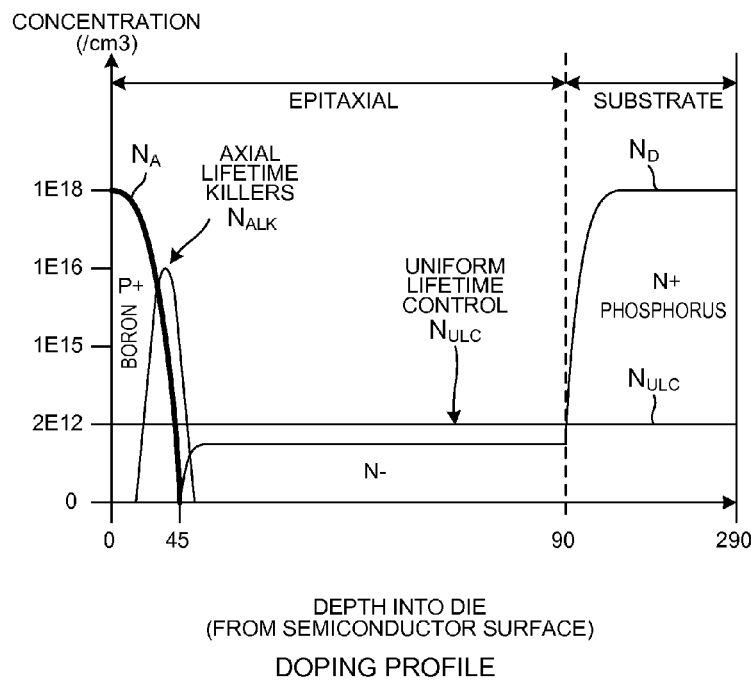
FIG. 6 is a diagram that shows a doping profile of the die of FIGS. 1-5.

FIG. 6 is a diagram that shows the doping profile extending into the semiconductor surface starting at a point on the upper semiconductor surface 15 on the surface of the P+ type region 4. The P type dopant is boron. The N type dopant of the epitaxial layer 5 and of the substrate layer 14 is either phosphorus or arsenic. So-called "axial lifetime killers" are locally implanted to achieve an axial lifetime killer dose $N_{ALK}$ of about $2\times10^{12}$ recombination centers per square centimeter of silicon (denoted 2E12 $cm^{-2}$) at a depth of 8 um. The axial lifetime killer dopant that is implanted may, for example, be helium or protons. The axial life killers are locally implanted in the P+ type region 4 of the die to a depth of about 8 um, but are not implanted into the deep N– type material.

So-called "uniform lifetime control" processing is performed so that the background concentration $N_{ULC}$ of recombination centers throughout the thickness of the epitaxial and substrate layers (from the upper surface 15 to the lower surface 21) is about 200 to 1000 kGy (kilograys). The electron irradiation displaces silicon atoms from their normal crystal lattice sites, thereby creating recombination centers. The combination of local lifetime control and uniform lifetime control decreases the lifetime of minority carriers in the semiconductor material.

FIG. 7 is a table that sets forth characteristics of the various parts of the power diode die 1 of FIGS. 1-5.

Figure 8:
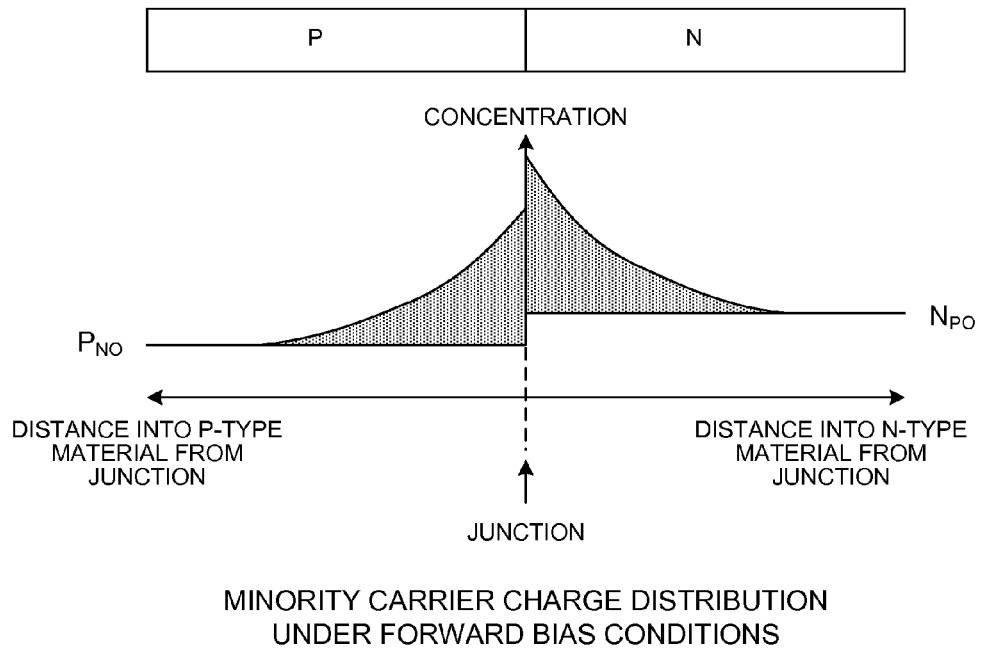
FIG. 8 is a diagram that illustrates minority carrier concentrations at a PN junction under forward bias conditions.

Operation of the power diode die 1 of FIGS. 1-5 is explained below in connection with FIGS. 8-13. FIG. 8 is a diagram that illustrates minority carrier charge distribution at the main PN junction of the die 1 under forward bias conditions. The main PN junction is the junction between P+ type region 4 and N– type layer 5. $P_{NO}$ is the background minority carrier concentration in the P+ type material on the left side of the PN junction. The minority carriers in the P+ type material are electrons, so the illustrated increasing concentration of charge carriers extending to the right in the diagram to the PN junction represents an increasing concentration of electrons. On the right side of the PN junction, the silicon material is N– type material of layer 5. $N_{PO}$ is the background minority carrier concentration in the N– type material on the right side of the PN junction. The minority carriers in the N– type material are holes, so the illustrated increasing concentration of charge carriers extending to the left in the diagram to the PN junction represents an increasing concentration of holes. The sum of the concentration of majority carriers and the concentration of minority carriers on one side of the PN junction matches the sum of the concentration of majority carriers and the concentration of minority carriers on other side. Due to the P type semiconductor material being more heavily doped with P type dopants than the N type semiconductor material is doped with N type dopants, $P_{NO}$ is lower than $N_{PO}$. As is known in the art, a depletion region exists at the PN junction. This depletion region extends to the left into the P type material from the PN junction, and also extends to the right into the N type material from the PN junction. Conduction through the forward biased PN junction is primarily due to majority carriers. Holes pass from the left to right through the P type material on the left side of the PN junction and electrons pass from the right to the left through the N type material on the right side of the PN junction. This hole and electron flow constitutes the current flow through the PN junction structure.

Figure 9:
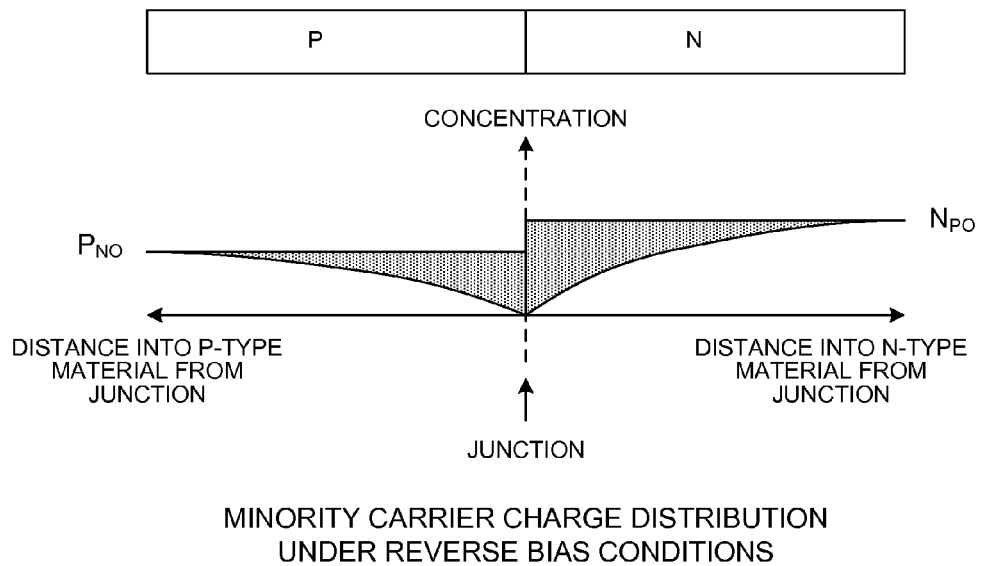
FIG. 9 is a diagram that illustrates minority carrier concentrations at a PN junction under reverse bias conditions.

FIG. 9 is a diagram that illustrates minority carrier charge distribution at the PN junction under reverse bias conditions. Due to the reverse bias voltage, the depletion region is expanded both into the P type material from the PN junction as well as into the N type material from the PN junction. The increased reverse bias electric field across the PN junction sweeps minority carriers that are in the depletion region across the PN junction. For example, electrons that are minority carriers in the depletion region on the left side of the PN junction are moved under the force of the electric field to the right and so that they cross the PN junction. Similarly, holes that are minority carriers in the depletion region on the right side of the PN junction are moved under the force of the electric field in the opposite direction to the left so that they cross the PN junction. The result is the illustrated decreased concentration of minority carriers in the depletion region where the increased reverse bias electric field exists.

Figure 10:
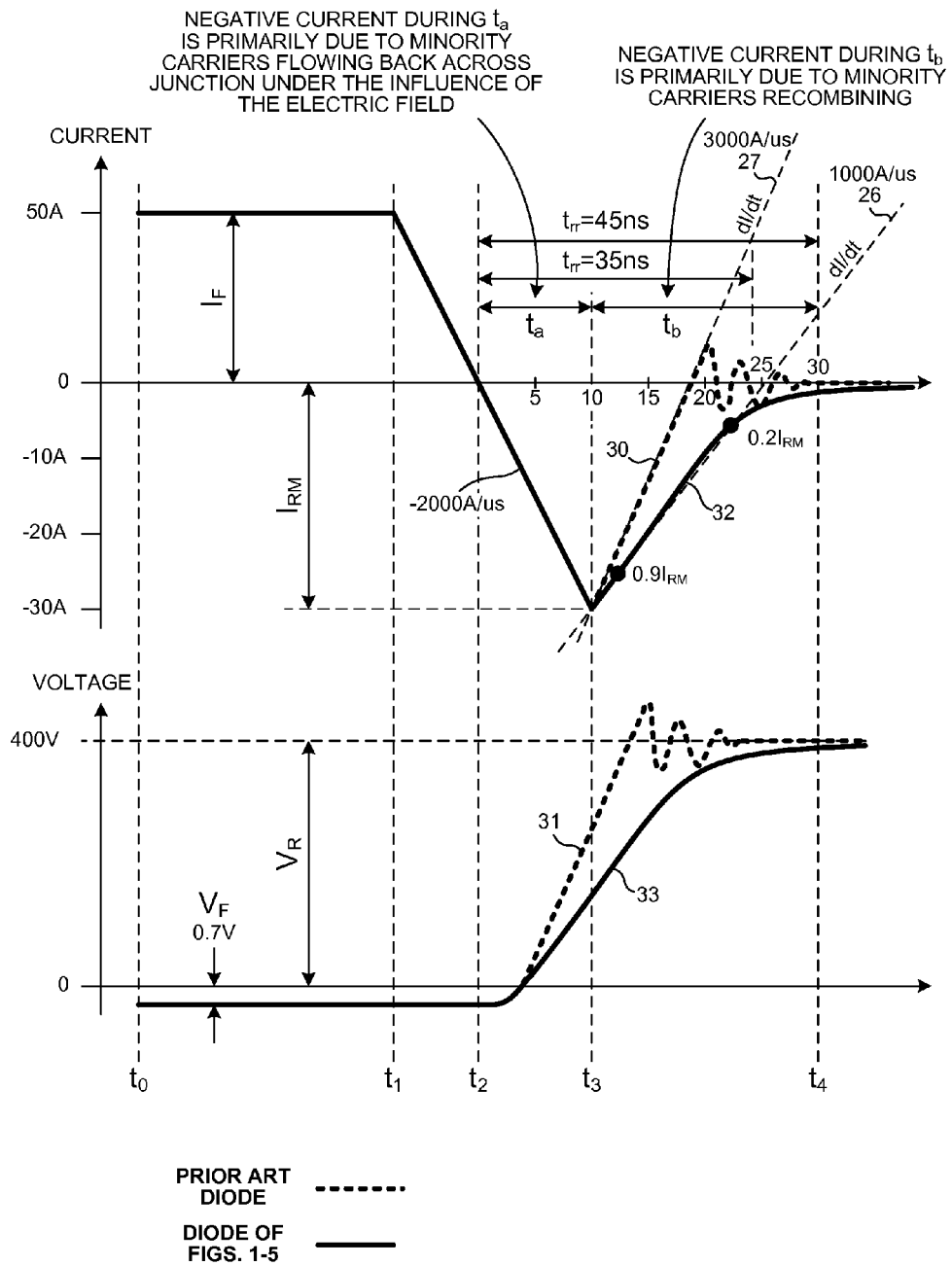
FIG. 10 is a waveform diagram that shows current and voltage waveforms for the die of FIGS. 1-5.

If the voltage across the main PN junction were to be changed from a forward bias condition as shown in FIG. 8 to a reverse bias condition as shown in FIG. 9, then minority carriers would have to move. The result of this movement of minority carriers is illustrated in FIG. 10. In the example of FIG. 10, prior to time $t_1$ the PN junction is forward biased. A 0.7 forward voltage exists across the diode, and a forward current $I_F$ flows from the anode electrode to the cathode electrode. The magnitude of the forward current determines the number of charge carriers passing through the depletion region at the PN junction. The voltage across the PN junction is then switched from the forward voltage to a reverse voltage. During the time period $t_a$ between time $t_1$ and time $t_2$, minority carriers move across the PN junction to bring about the change in minority carrier concentration illustrated in connection with FIGS. 8 and 9. Minority carriers that are present in the depleted regions on either side of the PN junction due to the forward current are then acted upon in an opposite way by the reversed voltage across the PN junction. These minority carriers reverse direction and are swept back across the PN junction. Starting at about time $t_3$, the effect of moving minority carriers under the force of the reverse bias decreases and another effect of recombination starts to take precedence. During time $t_b$ between time $t_3$ and $t_4$ excess minority carriers in the depletion region recombine at recombination centers. A higher concentration of recombination centers in the semiconductor material therefore results in a corresponding higher rate of recombination. A lower concentration of recombination centers in the semiconductor material results in a corresponding lower rate of recombination. As the minority carriers are consumed by such recombination, the reverse current decreases from its negative peak value of $I_{RM}$. The reverse voltage across the PN junction increases. In the illustrated example, the PN junction is being used to block a reverse voltage of 400V. The reverse voltage across the PN junction is about 400V by time $t_4$.

In a conventional power diode that does not have the novel P+ anode region structure of FIGS. 1-5, there is an imbalance in the amount of stored minority carrier charge per unit area across the surface of the die. When the die is considered from the top-down perspective, there is less depletion region per unit area at the center of die than there is at the periphery of the die. At the periphery of the die there is depletion region in the horizontally extending direction extending laterally away from the PN junction as well as extending vertically down from the bottom of the P+ anode layer. At the center of the die, in contrast, there is no laterally extending depletion region component. There is more minority carrier charge storage per unit area in the peripheral edge region of the die as compared to the central region of the die. As a consequence of this imbalance in the amount of minority carrier charge storage per unit area across the die, optimization of removal of this charge in such a way as to achieve a "soft" reverse recovery characteristic is not achieved. Minority carriers are removed too quickly from some parts of the PN junction, and these parts of the PN junction have snappy characteristic. As a result, the overall diode structure may exhibit a snappy behavior. Reference numeral 30 in FIG. 10 identifies the reverse recovery current of such a conventional diode during a reverse recovery episode. Reference numeral 31 in FIG. 10 identifies the corresponding voltage across the conventional diode during the reverse recovery episode.

In accordance with one novel aspect, the mesa structures 8-13 and the associated P+ type region 4 that has the six openings increase the amount of minority carriers stored in the center part of the diode die 1. The N− type material of the mesa structures meets the P+ type semiconductor material of the P+ type region 4 and forms six vertically extending tubular PN junction extensions. These six vertically extending tubular PN junction extensions extend upward from the planar horizontally extending PN junction beneath the P+ type region 4. During forward conduction, minority carriers are present in these six vertically extending tubular PN junction extensions. When the diode die 1 is then switched from the forward voltage condition to a reverse voltage condition, the supply of minority carriers to be discharged is more uniform per unit area across the die 1 as compared to the conventional power diode die. Reference numeral 32 in FIG. 10 identifies the exhibited reverse recovery current waveform of the novel diode die 1 of FIGS. 1-5 during a reverse recovery episode. Reference numeral 33 in FIG. 10 identifies the corresponding voltage across the novel diode die 1 of FIGS. 1-5 during the reverse recovery episode.

Adding to the overall amount of PN junction of the die 1 without changing any other characteristic of the die structure would serve to increase the magnitude of $I_{RM}$ because there would be more minority charge to clear in a reverse recovery episode. To counter this effect that would otherwise increase $I_{RM}$, the background concentration of recombination centers $N_{ULC}$ is increased to $2 \times 10^{12}$ recombination centers per cubic centimeter (denoted 2E12 $cm^{-3}$) as indicated in FIG. 6. Charge carriers that recombine in the depletion region do not contribute to current conduction. The increase in recombination center concentration increases charge carrier recombination and is made to compensate for the increased amount of minority charge present in larger PN junction of the diode die. This allows the $I_{RM}$ of the novel diode die 1 to be the same as the conventional diode of waveforms 30 and 31 even though the novel die 1 has the six vertically extending tubular PN junction extensions.

A function of axial lifetime killers (such as are created by Helium implantation or Proton implantation) is to reduce injection efficiency of holes into the N− during switching. The injection of holes contributes to the maximum reverse recovery current ($I_{RM}$). A function of uniform lifetime killers (such as are created by electron irradiation) is to reduce the $t_{rr}$ value. In a conventional power diode die, during fast switching from the on-state to the blocking state, charge carriers diffuse from the die periphery (i.e. the passivation zone) to the center of the device and this movement of charge has a positive effect on soft recovery performance. Because the relative amount of periphery area to central area diminishes with increasing total die area (given the same design and reverse voltage performance), soft recovery performance is generally seen to degrade with increasing die size. In accordance with one novel aspect, by virtue of the novel anode, "dead" areas are provided in the center of the die that provide local sources of minority charge carriers. The larger number of local minority carriers take longer to recombine, and therefore cause the diode to have a less steep di/dt slope 26 as compared to the steeper di/dt slope 27 that the diode would otherwise have.

Regardless of the mechanisms at play at the junction that give rise to the observed advantages, and regardless of whether the reasons for the improved performance of the structure of FIGS. 1-5 is due to added minority carrier storage in the center of the die or not, the dopant concentrations and recombination center concentrations and mesa structure geometries are adjustable in an empirical manner to achieve the waveforms 32 and 33 of FIG. 10. The novel diode die 1 has the same approximate $I_{RM}$ as the prior art diode, but the novel diode die 1 has a softer reverse recovery characteristic, without overshoot and without oscillation. The di/dt slope 26 during time $t_b$ in the novel diode die 1 is approximately 1000 A/us under the conditions of FIG. 10, and the novel diode die has a $t_{rr}$ of about 45 ns; whereas the di/dt slope 27 during time $t_b$ in the prior art diode is approximately 3000 A/us under the conditions of FIG. 10 and the prior art diode has a $t_{rr}$ of about 35 ns. The waveform diagram of FIG. 10 is not to scale.

The 50 micron to 300 micron width of a mesa structure is, in one example, 140 microns and is just a wide enough separation that the lateral extending depletion regions of the PN junction on either side of the mesa extend inward and touch and merge at the rated reverse voltage of the diode. This mesa width generally is about twice the thickness of the N− type layer 5. In the example of FIGS. 1-5, the 140 micron width of a mesa is 140/60 (2.33) times the 60 micron thickness of N− type layer 5. The optimal width can also be empirically determined by making diodes with a range of mesa widths, and then testing the diodes to find the diode with the best performance.

FIG. 11 is a table that sets forth a comparison of the novel diode die 1 of FIG. 1-5 to the prior art diode structure. The prior art diode structure being compared is of identical construction to the novel diode die 1 of FIG. 1-5, except that the prior art diode structure does not have the novel mesa structures 8-13 and does not have the increased recombination center concentrations described above.

Figure 12:
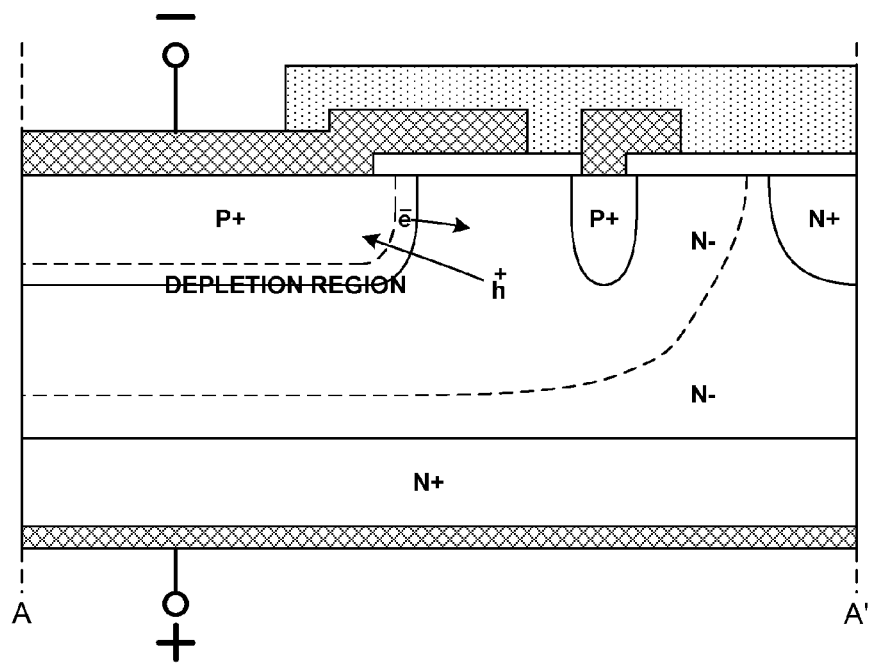
FIG. 12 is a cross-sectional diagram that illustrates movement of minority carriers in a peripheral portion of the die of FIGS. 1-5 when the voltage across the die switches from a forward voltage to a reverse voltage.

FIG. 12 is a diagram that illustrates the movement of minority carriers during time $t_a$ in a peripheral area of the novel diode die 1 of FIGS. 1-5. Note that the depletion region extends both laterally to the right as well as vertically down from the P+ type region 4.

Figure 13:
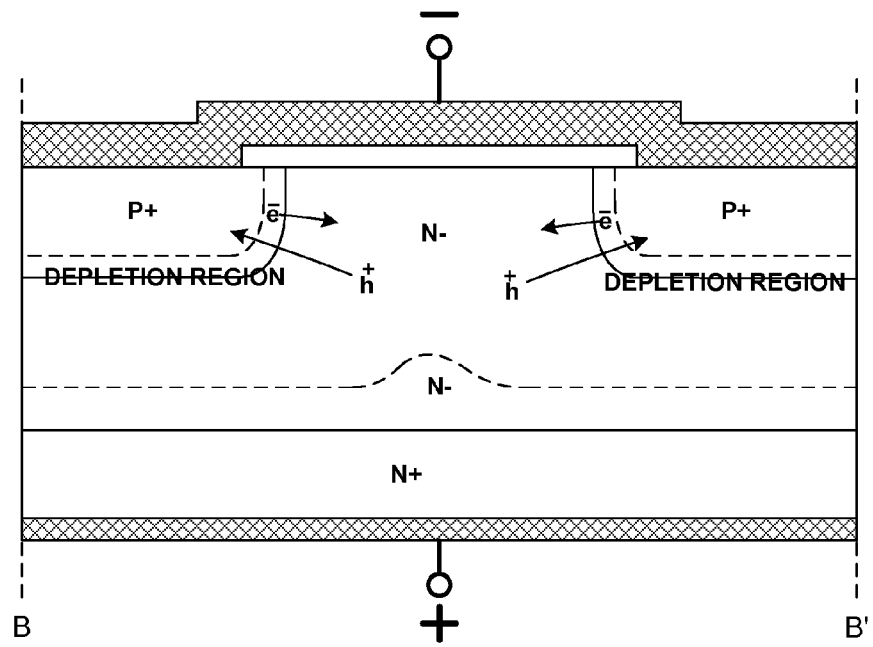
FIG. 13 is a cross-sectional diagram that illustrates movement of minority carriers in a central portion of the die of FIGS. 1-5 when the voltage across the die switches from a forward voltage to a reverse voltage.

FIG. 13 is a diagram that illustrates the movement of minority carriers during time $t_a$ in one of the mesa areas of the novel diode die 1 of FIGS. 1-5. Note that there is a larger volume of depleted silicon in the mesa area as compared to other areas beneath the P+ type region 4 where there is no mesa and where the depletion region can only extend vertically downward from the P+ type region 4. The increased amount of depleted silicon in the areas of the mesas 8-13 serves to balance the amount minority carriers present (at the time of switching) per unit area across the die.

Figure 14:
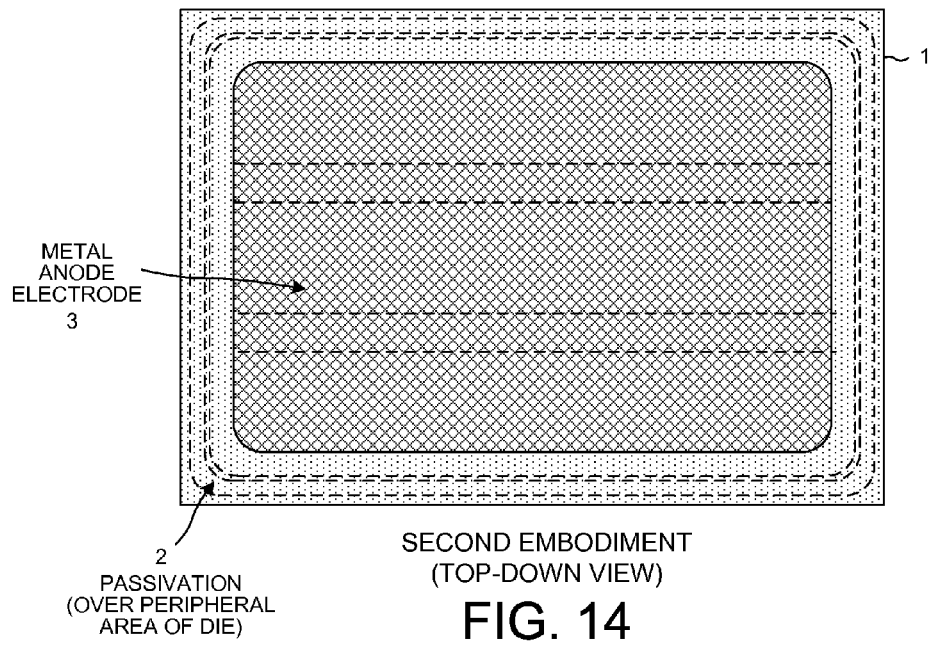
FIG. 14 is a top-down view of a second embodiment of a die that employs centralized auxiliary minority carrier storage in accordance with a second novel aspect.
Figure 15:
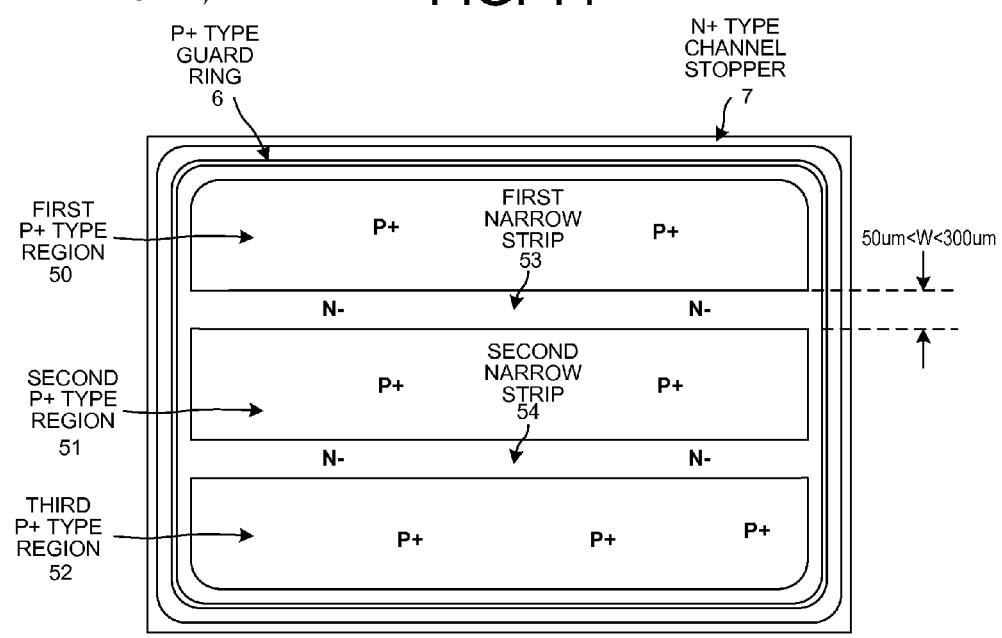
FIG. 15 is a top-down diagram of the die of the second embodiment with no metallization, insulation, or passivation layers shown.

FIGS. 14 and 15 illustrate a second embodiment of novel diode die 1. In the second embodiment, there are three P+ type regions 50, 51 and 52. Rather than the added minority charge storage in the center of the die being provided in the form of rectangular mesa structures as illustrated in top-down perspective in FIG. 2, in the second embodiment of FIGS. 14 and 15 the added minority charge storage areas at the center of the die are added by providing horizontally-extending narrow elongated strips 53 and 54 of the N− type material of layer 5. These elongated strips extend through the center portion of the die. The elongated strips 53 and 54 of the N− type material of layer 5 extend up to the plane of the upper planar surface of the semiconductor portion of die 1. A corresponding narrow strip of the third dielectric layer is disposed to cover each of the two narrow strips of N− type material so that the metal of the metal anode electrode 3 does not contact the N− type material of layer 5 in the narrow strip regions. The metal of the metal anode electrode 3, however, bridges over the narrow strip regions and makes contact with all three of the first, second and third P+ type regions 50-52. During forward conduction of the diode, forward current flows from the metal anode electrode 3, in parallel through the three P+ type regions 50-52, through the N− type epitaxial layer 5, down through the N+ type substrate layer 14, and to the metal cathode electrode 16. Each narrow strip structure in the second embodiment may be considered a narrow and elongated mesa structure in that the narrow strip structure extends up to the plane of the upper surface of the semiconductor material and at that plane has an elongated strip-like planar surface.

Figure 16:
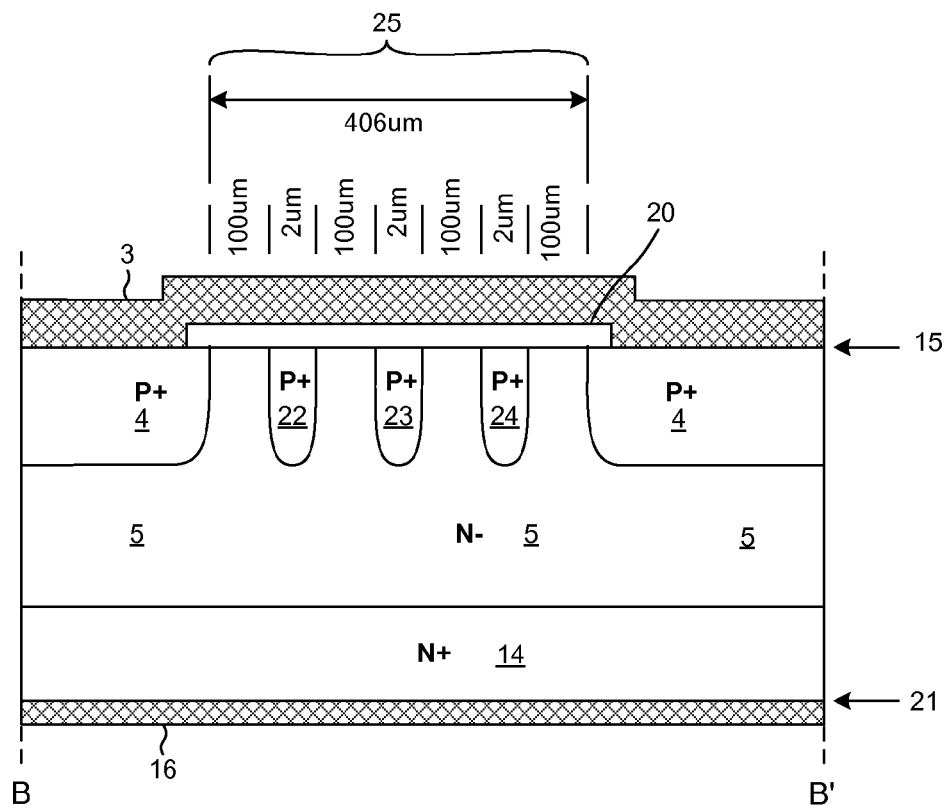
FIG. 16 is a cross-sectional diagram of a mesa structure or a narrow strip structure of the second embodiment, where the mesa or narrow strip is relatively wide and has floating P+ type regions.

Two embodiments are set forth above, but the broader notion of a contoured PN junction that provides more minority carrier charge storage areas in the central portion of the die (to help maintain uniform minority carrier movement and recombination during reverse recovery episodes) can take on other forms. Regions of minority carrier charge storage beneath the metal cathode electrode can, for example, be provided using the structure shown in FIG. 16. Rather than the mesa structures having a narrow width of 140 um as indicated in FIG. 4, in the example of FIG. 16 each mesa structure is 406 um wide. The structure of the diode die 1 in the example of FIG. 16 is otherwise the same as in the diode die of FIGS. 1-5. To reduce field strength under the pad feature 20, multiple floating P+ type regions 22-24 extend down from surface 15 into the N− type material of the mesa structure as shown. Each floating P+ type region is 2 um wide, and approximately 1000 um long, and is separated from another adjacent floating P+ type region or from an adjacent P+ type region 4 by 100 um of N− type semiconductor material of the N− type layer 5. The gap 25 in the illustrated example is 406 um wide for a diode with a rate 200 ampere forward current, but in other examples the gap 25 may be made wider or narrower by providing more or fewer floating P+ type regions and/or by changing the dimensions and separations of the structures. The floating P+ type regions are not limited to the use in mesas per se, but rather also can be provided in the narrow strip embodiment of FIGS. 14 and 15. In the narrow strip embodiment of FIGS. 14 and 15, the first and second narrow strips 53 and 54 are made wider (for example, 406 um). Parallel extending floating P+ type regions are formed to extend down into the N− type material of layer 5 in the area of each of these narrow strip regions. The floating P+ type regions are floating in that they are not electrically connected to any metal electrode or to the P+ type anode region 4.

Figure 17:
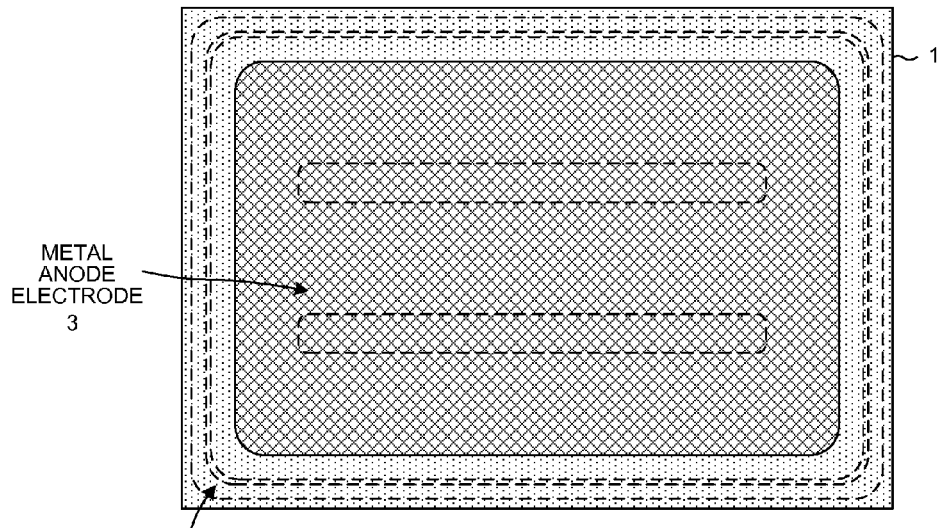
FIGS. 17 and 18 are diagrams of a third embodiment.
Figure 18:
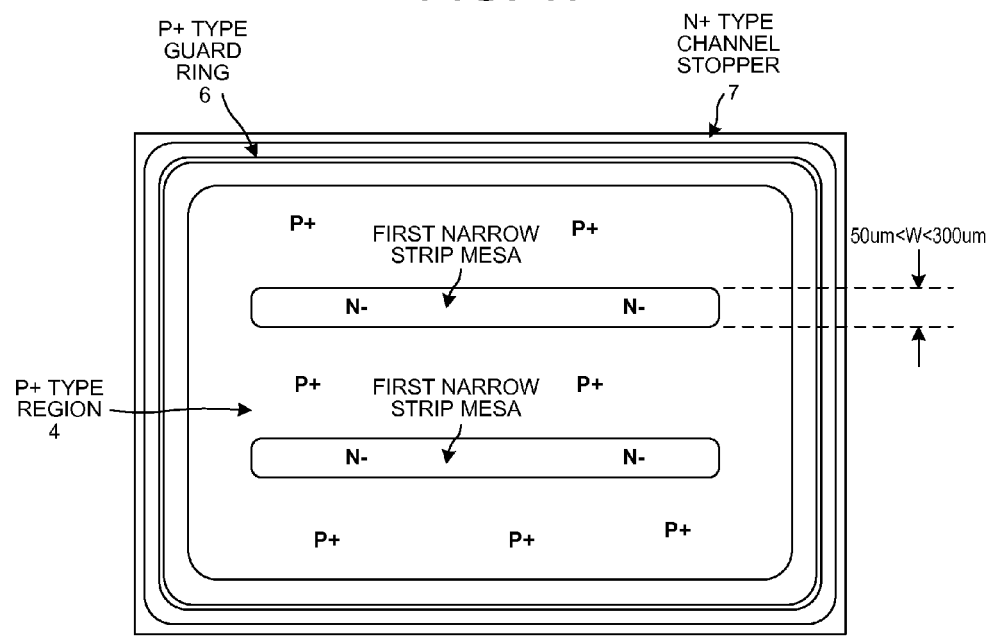

FIGS. 17 and 18 are diagrams of a third embodiment in which there are island-shaped mesa structures, but the islands are of an elongated strip-like shape. In the embodiment of FIGS. 17 and 18 there is, however, only one P+ type anode region 4, whereas in the embodiment of FIGS. 14 and 15 described above there are multiple P+ type regions.

Figure 19:
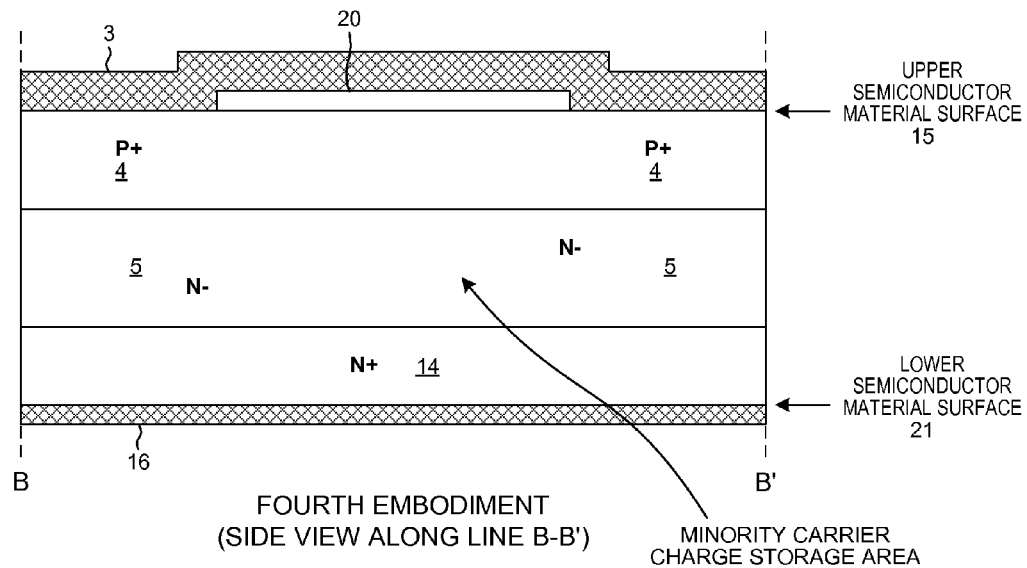
FIGS. 19 and 20 are diagrams of a fourth embodiment.
Figure 20:
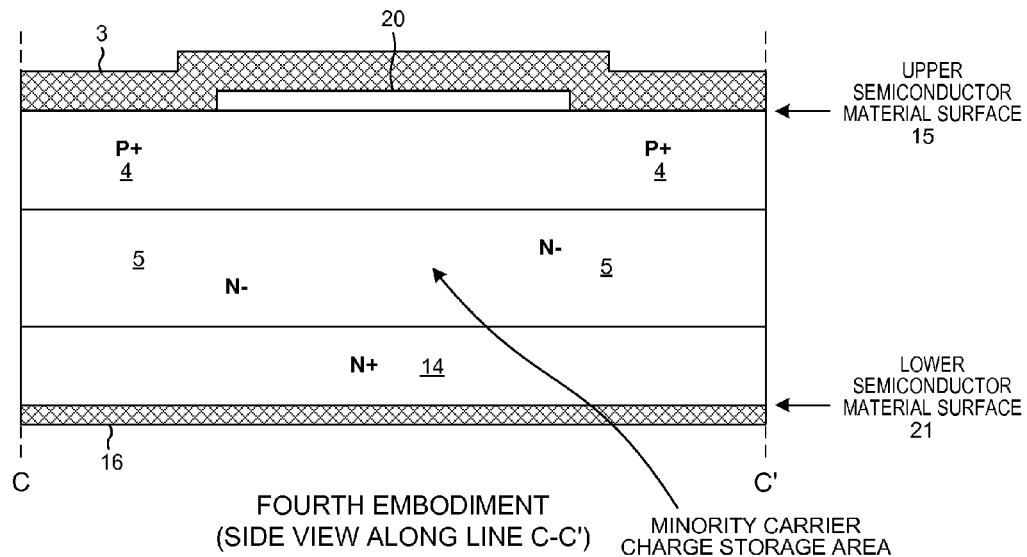

FIGS. 19 and 20 are diagrams of a fourth embodiment in which there are no mesa structures of upward extending N− type material as in the embodiment of FIGS. 1-5, but rather there is a single P+ type anode region 4 with a planar bottom boundary. Where there are mesas in the embodiment of FIGS. 1-5, however, in the fourth embodiment of FIGS. 19 and 20 there are areas at the upper semiconductor surface of the P+ type anode region 4 that do not make direct contact with the overlying metal anode electrode 3 (as shown) due to intervening pad features of the thin field dielectric layer. Pad feature 20 in FIGS. 19 and 20 is one such pad feature overlying one such minority carrier charge storage area. A minority carrier charge storage area exists under each such area where there is no direct contact between the metal anode electrode 3 and the semiconductor material of the P+ type region 4.

Figure 21:
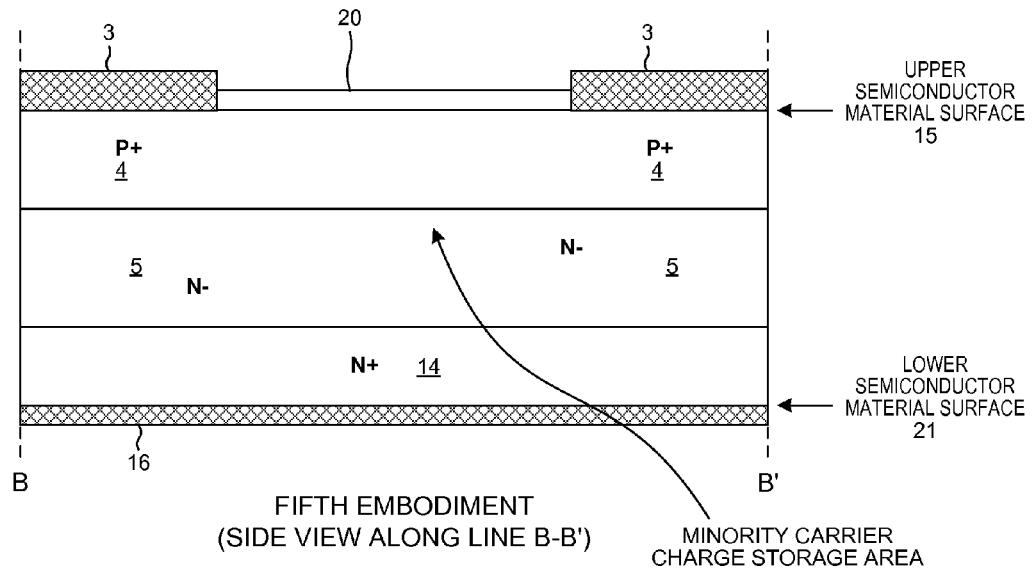
FIGS. 21 and 22 are diagrams of a fifth embodiment.
Figure 22:
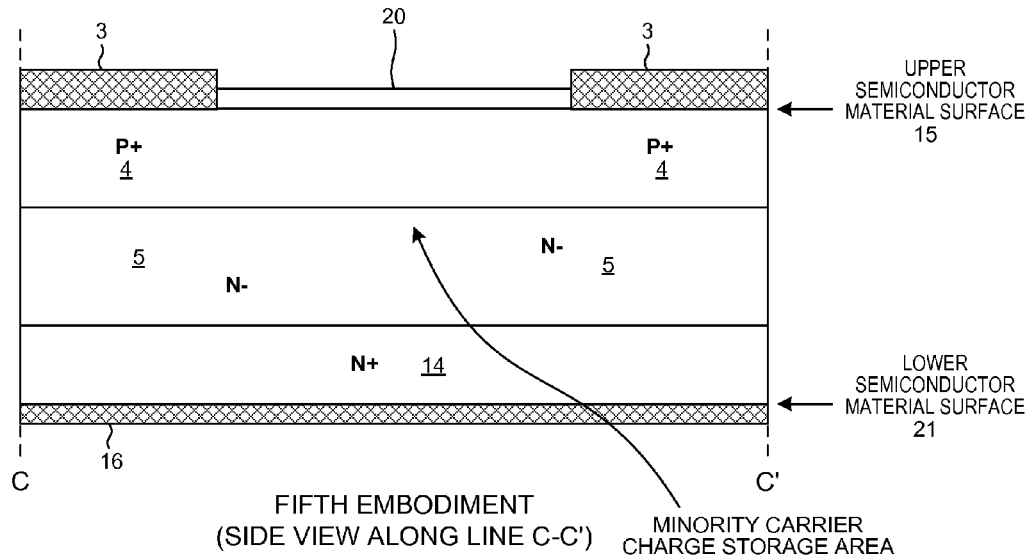

FIGS. 21 and 22 are diagrams of a fifth embodiment. The fifth embodiment is similar the fourth embodiment, except that metal of the metal anode electrode 3 does not extend over the minority carrier charge storage area. In one example there is also no pad feature 20 of the thin field dielectric layer disposed over the minority carrier charge storage area.

Figure 23:
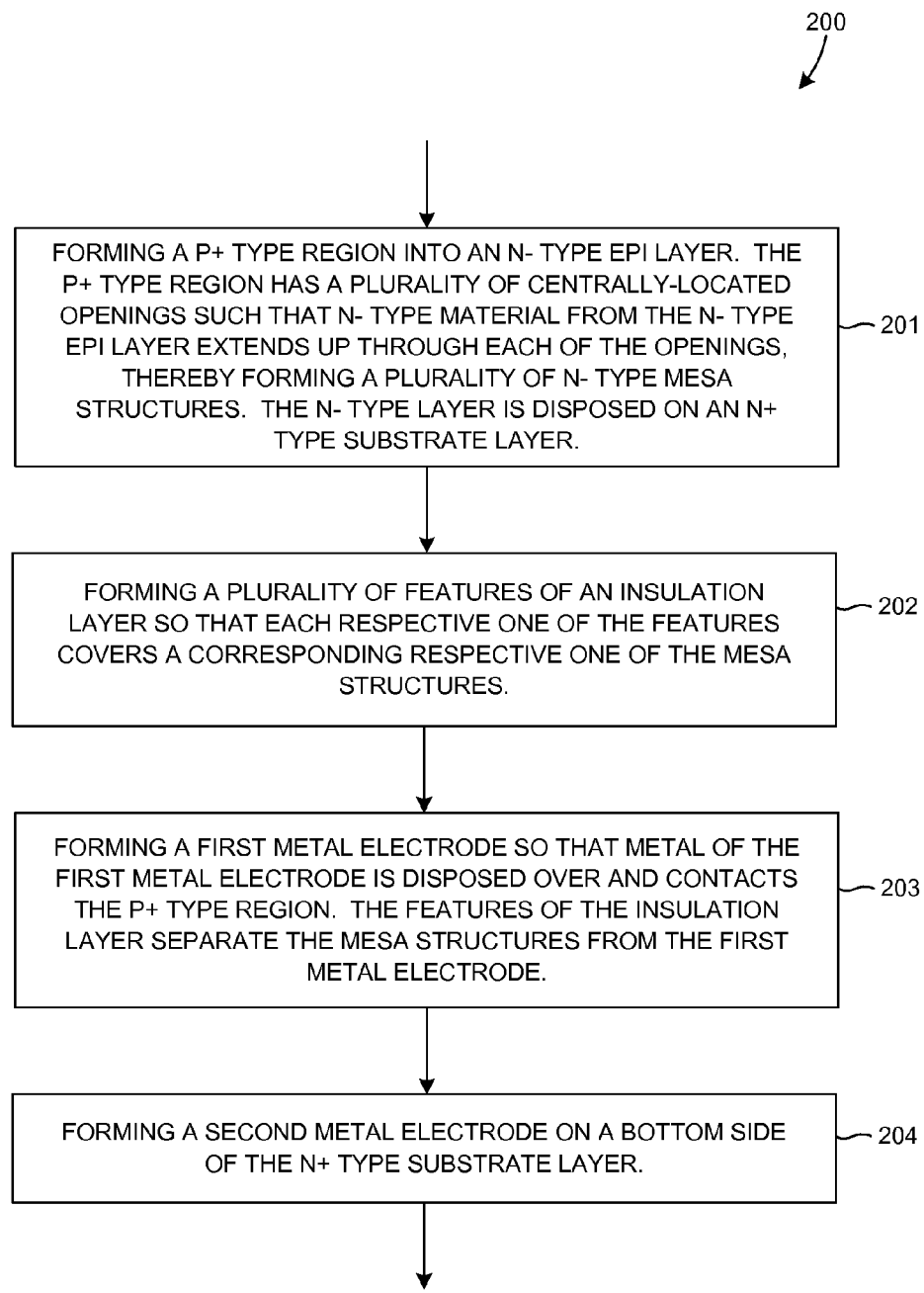
FIG. 23 is a flow chart of a method 200 in accordance with one novel aspect.

FIG. 23 is a flowchart of a method 200 in accordance with one novel aspect. In step 201, a P+ type region is formed into an upper surface of an N-type epitaxial silicon layer. The P+ type region has a plurality of centrally-located openings such that N− type semiconductor material from the N− type epitaxial layer extends up through each of the openings, thereby forming a plurality of N− type mesa structures. Each of the N− type mesa structures has a planar top surface disposed in the plane of the upper surface of the N− type epitaxial layer. The N− type epitaxial layer is disposed on an N+ type substrate layer. In step 202, a plurality of features of an insulation layer are formed so that each respective one of the features covers a corresponding respective one of the mesa structures. In step 203, a first metal electrode (for example, an anode electrode) is formed over the features of the insulation layer so that metal of the first metal electrode is disposed over and contacts the P+ type region. Substantially all of the upper planar surface of the P+ type region is in contact with the first metal electrode. The features of the insulation layer separate the mesa structures from the first metal electrode. In step 204, a second metal electrode (for example, a cathode electrode) is formed on a bottom side of the N+ type substrate layer. In a case in which the first metal electrode is an anode electrode of a diode and where the second metal electrode is a cathode electrode of the diode, a forward current can flow under a forward voltage condition from the first metal electrode to the second metal electrode. Under a reverse blocking voltage condition, the diode blocks substantially all current from flowing in the reverse direction from the second metal electrode to the first metal electrode.

For additional detail on how to fabricate a power device into which the novel PN junction teachings of this patent document can be incorporated, see: 1) U.S. Pat. No. 8,093,652 B2, 2) U.S. Pat. No. 8,153,481 B2, and 3) U.S. Patent Application Publication US 2006/0255379 A1 (the entire subject matter of each of these patent documents is incorporated herein by reference).

Although certain specific embodiments are described above for instructional purposes, the teachings of this patent document have general applicability and are not limited to the specific embodiments described above. The PN junction structure, described above as having uniform minority charge carrier storage per unit area from its periphery to its center, is not limited to use in power diodes, but rather is also useful in other devices such as in an Insulated Gate Bipolar Transistor (IGBT), in a Field Effect Transistor (FET), in a Metal Oxide Semiconductor Field Effect Transistor (MOSFET), in a thyristor, and in a MOS Controlled Thyristor (MCT). Different ones of the PN junction structures of the first through fifth embodiments may be used in various combinations on the same die. Accordingly, various modifications, adaptations, and combinations of various features of the described embodiments can be practiced without departing from the scope of the invention as set forth in the claims.

What is claimed is:

1. A power diode semiconductor die comprising:
   a first layer of N+ type semiconductor material;
   a metal cathode electrode disposed underneath the first layer;
   a second layer of N− type semiconductor material disposed over the first layer, wherein the second layer has an upper surface that extends in a plane;
   a P+ type region of P+ type semiconductor material, wherein the P+ type region extends down from the plane into the second layer such that N− type semiconductor material of the second layer laterally surrounds the P+ type region in a ring, wherein the ring of the N− type semiconductor material extends up to the plane, and wherein the P+ type region is formed such that a plurality of N− type mesas of the N− type semiconductor material of the second layer extend up to the plane within the ring so that each N− type mesa is laterally surrounded at the plane by a ring of the P+ type semiconductor material of the P+ type region;
   a plurality of features of an insulation layer, where each respective one of the plurality of N− type mesas is covered by a corresponding respective one of the plurality of the features; and
   a metal anode electrode disposed over the P+ type region such that the plurality of features of the insulation layer separate the N− type mesas from the metal anode electrode, wherein the power diode semiconductor die is operable as a high voltage power diode to conduct a forward current from the metal anode electrode, through the P+ type region, and to the metal cathode electrode.

2. The power diode semiconductor die of claim 1, wherein the P+ type region has a mesh-shape defining a two-dimensional array of openings, and wherein each respective one of the plurality of N− type mesas extends through a corresponding respective one of the openings.

3. The power diode semiconductor die of claim 1, further comprising:
   a P+ guard ring of P+ type semiconductor material that extends around the P+ type region.

4. The power diode semiconductor die of claim 1, wherein each N− type mesa has an upper surface that extends in the plane, and wherein the upper surface has a shape taken from the ground consisting of: a rectangle, a square, an elongated strip, a circle, a polygon.

5. The power diode semiconductor die of claim 1, wherein each N− type mesa has an upper surface that extends in the plane, wherein the upper surface of each N− type mesa has a width and a length, and wherein the width is at least 50 microns and is less than 300 microns.

6. The power diode semiconductor die of claim 1, wherein each N− type mesa has an upper surface that extends in the plane, wherein the upper surface has an elongated strip shape, wherein the elongated strip shape has a width and a length, and wherein the length is substantially longer than the width.

7. The power diode semiconductor die of claim 1, further comprising:
   a plurality of floating P+ type regions of P+ type semiconductor material, wherein each respective one of the floating P+ type regions extends down from the plane into a corresponding respective one of the plurality of N− type mesa.

8. The power diode semiconductor die of claim 7, wherein more than one of the floating P+ type regions extends down into each of the N− type mesas.

9. The power diode semiconductor die of claim 1, wherein the N− type mesas are disposed in an array of rows and columns under a central area of the metal anode electrode when the die is considered from a top-down perspective, wherein there are relatively fewer N− type mesas in a peripheral area of the metal anode electrode when the die is considered from the top-down perspective, and wherein the peripheral area is more than two thirds as large as the central area.

10. A power diode semiconductor die comprising:
a first layer of N+ type semiconductor material;
a metal cathode electrode disposed underneath the first layer;
a second layer of N− type semiconductor material disposed over the first layer, wherein the second layer has a thickness and an upper surface that extends in a plane;
a first P+ type region of P+ type semiconductor material, wherein the first P+ type region extends down from the plane into the second layer such that N− type semiconductor material of the second layer laterally surrounds the first P+ type region in a ring;
a second P+ type region of P+ type semiconductor material, wherein the second P+ type region extends down from the plane into the second layer such that N− type semiconductor material of the second layer laterally surrounds the second P+ type region in a ring, wherein the first P+ type region is separated from the second P+ type region by a first strip of N− type semiconductor material of the second layer, wherein the first strip of N− type semiconductor material extends up to the plane and has a width that is more than twice the thickness of the second layer of N− type semiconductor material;
a first strip of an insulation layer, wherein the first strip of the insulation layer covers the first strip of N− type semiconductor material; and
a metal anode electrode disposed over the first and second P+ type regions such that the first strip of the insulation layer separates the first and second P+ type regions from the metal anode electrode, wherein the power diode semiconductor die is operable as a diode to conduct a forward current from the metal anode electrode, in parallel through the first and second P+ type regions, and to the metal cathode electrode.

11. The power diode semiconductor die of claim 10, further comprising:
a P+ guard ring of P+ type semiconductor material, wherein the first P+ type region is disposed within the P+ guard ring, wherein the second P+ type region is disposed within the P+ guard ring, and wherein the P+ guard ring does not extend between the first and second P+ type regions.

12. The power diode semiconductor die of claim 11, wherein the first strip of N− type semiconductor material has a width and a length, wherein the width is at least 50 microns and is less than 300 microns.

13. The power diode semiconductor die of claim 12, further comprising:
a third P+ type region of P+ type semiconductor material, wherein the third P+ type region extends down from the plane into the second layer such that N− type semiconductor material of the second layer laterally surrounds the third P+ type region in a ring, wherein the third P+ type region is separated from the second P+ type region by a second strip of N− type semiconductor material of the second layer, wherein the second strip of N− type semiconductor material extends up to the plane, wherein the second strip of N− type semiconductor material extends parallel to the first strip of N− type semiconductor material, and wherein when the power diode semiconductor die is operating as a diode the forward current is conducted from the metal anode electrode, in parallel through the first, second and third P+ type regions, and to the cathode anode electrode.

14. A high voltage power device comprising:
a layer of semiconductor material of a first conductivity type, wherein the layer has an upper surface that extends in a plane;
a region of semiconductor material of a second conductivity type, wherein the region extends down from the plane into the layer such that semiconductor material of the first conductivity type laterally surrounds the region in a ring, and wherein the region is formed such that a plurality of mesas of the semiconductor material of the layer extend up to the plane within the ring so that each mesa is laterally surrounded at the plane by semiconductor material of the second conductivity type;
a plurality of features of an insulation layer, where each respective one of the plurality of mesas is entirely covered at the plane by a corresponding respective one of the plurality of features; and
a metal electrode disposed over the region such that the plurality of features separates the plurality of mesas from the first metal electrode, wherein the high voltage power device is taken from the group consisting of: a high voltage power diode, an Insulated Gate Bipolar Transistor (IGBT), a Field Effect Transistor (FET), Metal Oxide Semiconductor Field Effect Transistor (MOSFET), a thyristor, and MOS Controlled Thyristor (MCT).

15. The power device of claim 14, wherein there are at least four mesas, and wherein the mesas are disposed in an array of rows and columns.

16. The power device of claim 14, wherein each mesa has an upper surface that extends in the plane, wherein the upper surface of each mesa has a width and a length, and wherein the width is at least 50 microns and is less than 300 microns.

17. The power device of claim 14, wherein the layer of semiconductor material of the first conductivity type has a thickness, wherein each mesa has an upper surface that extends in the plane, and wherein the upper surface of each mesa has a width that is more than twice the thickness of the layer of semiconductor material of the first conductivity type.

18. A method of manufacturing a high voltage power diode involving a first layer of N+ type semiconductor material and a second layer of N− type semiconductor material disposed over the first layer, wherein the second layer has an upper surface that extends in a plane, the method of manufacturing comprising:
forming a P+ type region of P+ type semiconductor material into the second layer of the N− type semiconductor material, wherein the P+ type region extends down from the plane into the second layer such that N− type semiconductor material of the second layer laterally surrounds the P+ type region in a ring, wherein the ring of the N− type semiconductor material extends up to the plane, and wherein the P+ type region is formed such that a plurality of N− type mesas of the N− type semiconductor material of the second layer extend up to the plane within the ring so that each N− type mesa is laterally surrounded at the plane by the P+ type semiconductor material of the P+ type region;
forming a plurality of features of an insulation layer so that each respective one of the features covers a corresponding respective one of the plurality of N− type mesas; and
forming a first metal electrode so that the first metal electrode is disposed over and contacts the P+ type region and so that the plurality of features of the insulation layer separate the N− type mesas from the first metal electrode, wherein the first metal electrode is formed so that during an operation of the high voltage power diode a forward current can flow from the first metal electrode, through the P+ type region, and to a second metal electrode disposed below the first layer.

19. The method of manufacturing the high voltage power device of claim 18, wherein there are at least four mesas, and wherein the plurality of mesas are disposed in an array of rows and columns, wherein each mesa has an upper surface that extends in the plane, wherein the upper surface of each mesa has a width and a length, and wherein the width is at least 50 microns and is less than 300 microns.

20. A method of manufacturing a high voltage power diode involving a first layer of N+ type semiconductor material and a second layer of N− type semiconductor material disposed over the first layer, wherein the second layer has an upper surface that extends in a plane, the method of manufacturing comprising:

forming a P+ type region of P+ type semiconductor material into the second layer of the N− type semiconductor material, wherein the P+ type region extends down from the plane into the second layer such that N− type semiconductor material of the second layer laterally surrounds the P+ type region in a ring, wherein the ring of the N− type semiconductor material extends up to the plane, and wherein the P+ type region is formed such that a plurality of N− type mesas of the N− type semiconductor material of the second layer extend up to the plane within the ring so that each N− type mesa is laterally surrounded at the plane by the P+ type semiconductor material of the P+ type region;

forming a plurality of features of an insulation layer so that each respective one of the features covers a corresponding respective one of the plurality of N− type mesas;

forming a first metal electrode so that the first metal electrode is disposed over and contacts the P+ type region and so that the plurality of features of the insulation layer separate the N− type mesas from the first metal electrode, wherein the first metal electrode is formed so that during an operation of the high voltage power diode a forward current can flow from the first metal electrode, through the P+ type region, and to a second metal electrode disposed below the first layer; and processing the P+ type region, the second layer of N− type semiconductor material, and the first layer of N+ type semiconductor material to have a uniform recombination center concentration of at least 2×1012 recombination centers per cubic centimeter in the P+ type region, the second layer, and the first layer, wherein the processing is taken from the group consisting of: irradiating with electrons, implanting with platinum, implanting with gold.

21. A method of manufacturing a high voltage power diode involving a first layer of N+ type semiconductor material and a second layer of N− type semiconductor material disposed over the first layer, wherein the second layer has an upper surface that extends in a plane, the method of manufacturing comprising:

forming a first P+ type region of P+ type semiconductor material into the second layer of the N− type semiconductor material, wherein first P+ type region extends down from the plane into the second layer such that N− type semiconductor material of the second layer laterally surrounds the first P+ type region in a ring, wherein the ring of the N− type semiconductor material extends up to the plane;

forming a second P+ type region of P+ type semiconductor material into the second layer of the N− type semiconductor material, wherein second P+ type region extends down from the plane into the second layer such that N− type semiconductor material of the second layer laterally surrounds the second P+ type region in a ring, wherein the ring of the N− type semiconductor material extends up to the plane, wherein the first and second P+ type regions are formed such that the first P+ type region is separated from the second P+ type region by a narrow strip of N− type semiconductor material of the second layer, wherein the narrow strip of N− type semiconductor material extends up to the plane, and wherein the narrow strip of N-type semiconductor material has a width that is at least 50 microns and is less than 300 microns;

forming a narrow strip of an insulation layer that covers the narrow strip of N− type semiconductor material;

forming a metal anode electrode so that the metal anode electrode is disposed over and contacts the first and second P+ type regions and so that the narrow strip of the insulation layer separates the metal anode electrode from the narrow strip of N− type semiconductor material; and providing a metal cathode electrode that is disposed on a lower surface of the first layer, wherein during an operation of the high voltage power diode a forward current can flow from the metal anode electrode to the metal cathode electrode.

22. The method of claim 21, wherein the second layer of N− type semiconductor material has a thickness that is less than half the width of the narrow strip of N-type semiconductor material.

* * * * *